United States Patent [19]
Mobley et al.

[11] Patent Number: 6,141,281
[45] Date of Patent: Oct. 31, 2000

[54] TECHNIQUE FOR REDUCING ELEMENT DISABLE FUSE PITCH REQUIREMENTS IN AN INTEGRATED CIRCUIT DEVICE INCORPORATING REPLACEABLE CIRCUIT ELEMENTS

[75] Inventors: Kenneth J. Mobley; Steve W. Ash, both of Colorado Springs, Colo.

[73] Assignee: Enhanced Memory Systems, Inc., Colorado Springs, Colo.

[21] Appl. No.: 09/069,468

[22] Filed: Apr. 29, 1998

[51] Int. Cl.[7] .................................................. G11C 7/00
[52] U.S. Cl. ...................................... 365/225.7; 365/200
[58] Field of Search ................................ 365/96, 225.7, 365/200, 189.02

[56] References Cited

U.S. PATENT DOCUMENTS

| | | | |
|---|---|---|---|
| 5,471,426 | 11/1995 | McClure | 365/200 |
| 5,596,535 | 1/1997 | Mushya | 365/200 |
| 5,742,547 | 4/1998 | Lee | 365/200 |

*Primary Examiner*—Son Mai
*Attorney, Agent, or Firm*—William J. Kubida, Esq.; Holland & Hart LLP

[57] ABSTRACT

A technique for reducing element disable fuse pitch requirements in an integrated circuit device incorporating replaceable elements wherein each group of replaceable elements contains a circuit which enables an element group within a chained set to determine whether it is the "leftmost" (or first) element used within the set by monitoring the state of an adjacent node. The node will transition to a logic "low" level if (and only if) a fuse within the set, (and located to the left of the node) is "blown" (or opened). By then multiplexing signals to select one or more elements within the first group and additional signals to select one or more elements within the second group, the necessary determination can be made to disable any given pair of elements based on the state of the fuses, the adjacent nodes and the additional signals.

20 Claims, 4 Drawing Sheets

TECHNIQUE FOR REDUCING ELEMENT DISABLE FUSE PITCH REQUIREMENTS IN AN INTEGRATED CIRCUIT DEVICE INCORPORATING REPLACEABLE CIRCUIT ELEMENTS

BACKGROUND OF THE INVENTION

The present invention relates, in general, to the field of integrated circuit memory arrays or other integrated circuit devices having circuit elements capable of being selectively disabled. More particularly, the present invention relates to a technique for reducing element disable fuse pitch requirements in an integrated circuit memory device incorporating replaceable and/or redundant memory elements.

In highly integrated memory arrays, an "element" (e.g. a word line) may be designed to be replaceable in the event one or more memory cells on the word line is non-functional due to processing defects and the like. As such, a defective element can be disabled and a redundant element then enabled to take its place. Most commonly, the defective element is disabled by blowing a fuse. Historically, this means that there must be one fuse for every replaceable element on the device.

Nevertheless, when redundant elements are used to improve the yield of memory devices, as in the example above, it is also highly desirable to minimize the width of such elements to reduce the overall impact such redundant elements have on device die size. Moreover, it is also advantageous to fashion the fusible link used to disable the defective elements as integral to the "real" element. Unfortunately, these design constraints frequently conflict because a replaceable element containing a disable fuse can be narrower than the fuse pitch, which is frequently relatively quite large in comparison.

In light of this, various means have heretofore been employed to obviate the need for element disable fuses in order to avoid this problem. However, such techniques are usually costly in terms of the speed penalty incurred when the memory array row decoder is activated.

SUMMARY OF THE INVENTION

In order to ameliorate this problem, a technique is herein disclosed which allows disable fuses to be placed on a multi-element pitch. Through the use of the technique of the present invention, each replaceable element is a member of a group of N elements which share a single disable fuse. Each such N element group contains a circuit which enables the group within a chained set of groups to determine whether it is the "leftmost" (or first) group used within the set by monitoring the state of an adjacent node. This node will remain at a logic "high" level and transition to a logic "low" level if (and only if) a fuse within the set, (and located to the left of the node) is blown. By then adding 2N signals which run horizontally across the width of the set, with the first N signals selecting one or more elements within the "leftmost" (or first) group and the second N signals selecting one or more elements within the "second" group, a determination can be made to disable any given two elements within the set based on the state of the fuse, the adjacent node and the horizontal signals.

What is disclosed herein is an integrated circuit device having a number of replaceable elements thereon. The integrated circuit device comprises a plurality of element disable fuses for controlling application of a first voltage source to a corresponding plurality of circuit nodes. A like plurality of first switching devices, each having a control terminal coupled to one of the corresponding plurality of circuit nodes is provided with the plurality of first switching devices being series connected together for coupling the first voltage source to a second voltage source. The plurality of series coupled first switching devices present a corresponding number of intermediate nodes thereat. The integrated circuit device further includes a like plurality of second switching devices, each having a control terminal also coupled to one of the corresponding plurality of circuit nodes. Each of the plurality of second switching devices couples one of the intermediate nodes to the second voltage source. In operation, the corresponding number of intermediate nodes are at a first potential when none of the plurality of element disable fuses is in an open state and a subset of the intermediate nodes distal from a given one of the intermediate nodes and the first voltage source are at a second potential when a corresponding one of the plurality of element disable fuses is in an open state.

Further disclosed herein is a method for disabling selected replaceable elements of an integrated circuit device. The method comprises the steps of providing a plurality of element disable fuses for controlling application of a first voltage source to a corresponding plurality of circuit nodes; switchably coupling each of the plurality of circuit nodes to each of a like plurality of series coupled intermediate nodes; monitoring the plurality of series coupled intermediate nodes and determining whether one of the plurality of element disable fuses is a first or subsequent fuse to be blown based upon a logic level monitored at the intermediate nodes.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
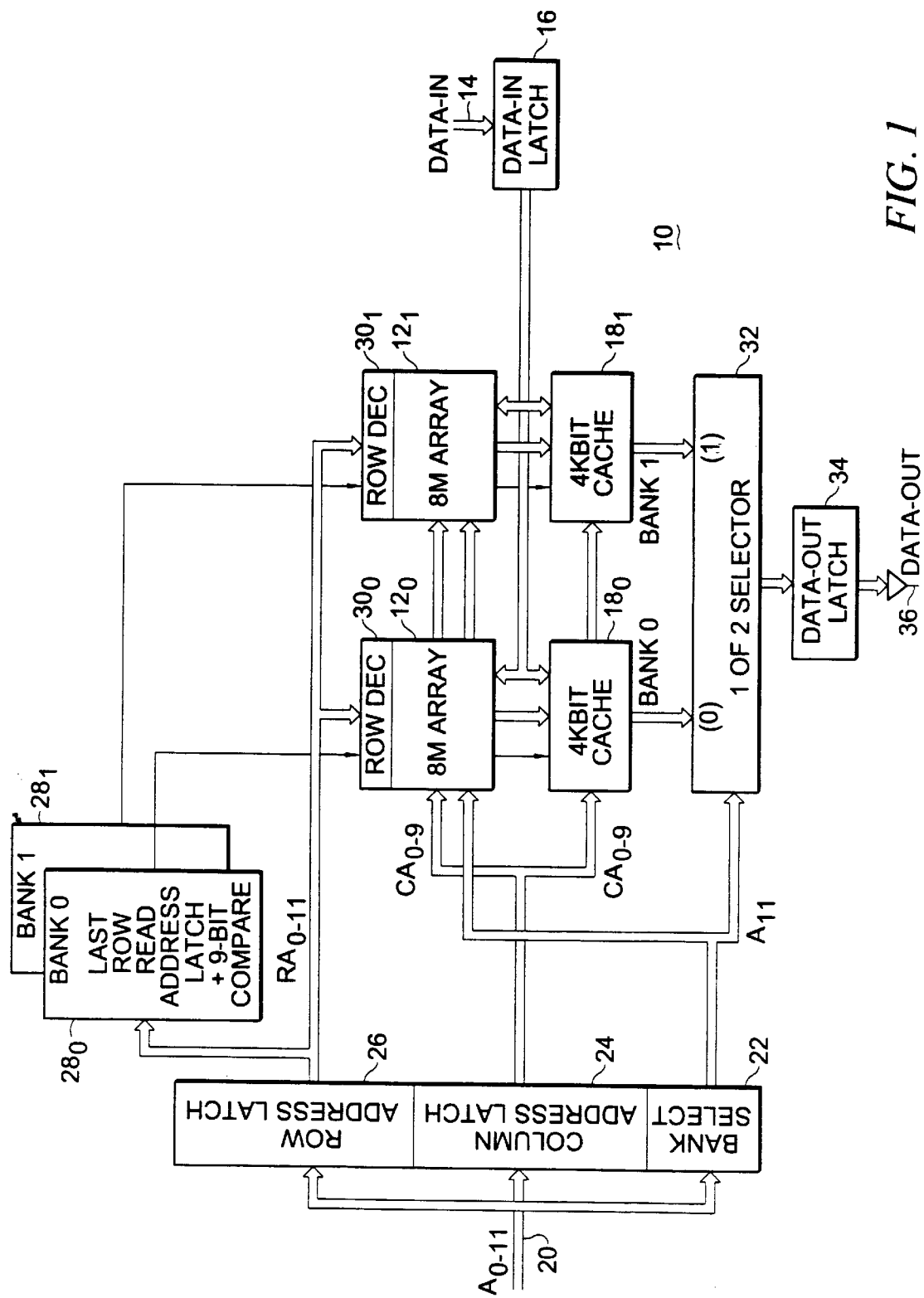
FIG. 1 is a functional block diagram of a representative integrated circuit memory device which may incorporate the technique of the present invention to disable defective circuit elements such as memory array word lines.

With reference now to FIG. 1, a representative memory device 10 for possible utilization of the technique for reducing element disable fuse pitch requirements in an integrated circuit device is shown. Although illustrated in conjunction with an enhanced synchronous dynamic random access memory device ("ESDRAM") 10 available from Enhanced Memory Systems, Inc., Colorado Springs, Colo., assignee of the present invention, the principles of the present invention are likewise to other memory devices having redundant memory cells or integrated circuits incorporating other types of redundant circuit elements.

The memory device 10 includes, in the specific embodiment illustrated, a pair of first and second memory arrays $12_0$ and $12_1$ (Bank 0 and Bank 1) to which data may be written, and from which data may be read. Data to be written to the memory device 10 is supplied on an external data bus ("Data-In") 14 and is selectively maintained in a data-in latch 16 prior to be written to the memory arrays $12_0$ and $12_1$ as well as an associated data cache $18_0$ and $18_1$.

Addresses for data read and write operations are supplied to the memory device 10 by means of an address bus 20, which supplies addresses to a bank select block 22 as well as a column address latch 24 and row address latch 26. The output of the row address latch 26 is supplied to a pair of last row read ("LRR") address latches $28_0$ and $28_1$ associated with each bank of the memory arrays $12_0$ and $12_1$ as well as the row decoders ("Row Dec") $30_0$ and $30_1$ coupled thereto. The output of the column address latch 24 is supplied to address both the memory arrays $12_0$ and $12_1$ as well as the data caches $18_0$ and $18_1$. The bank select block 22 is coupled to both the memory arrays $12_0$ and $12_1$ as well as to a 1-of-2 selector 32 coupled to the outputs of the data caches $18_0$ and $18_1$. Data read out from the memory device 10 is maintained in a data-out latch 34 coupled to the output of the 1-of-2 selector 32 and is then buffered and supplied on a data output bus ("Data-Out") 36.

The structure and function of the exemplary memory device 10 above described and shown is disclosed in more detail in U.S. patent application Ser. No. 60/059,869 filed provisionally on Sep. 24, 1997 for "Synchronous Dynamic Random Access Memory Device Incorporating a Static RAM Cache", the disclosure of which is herein specifically incorporated by this reference.

Figure 2:
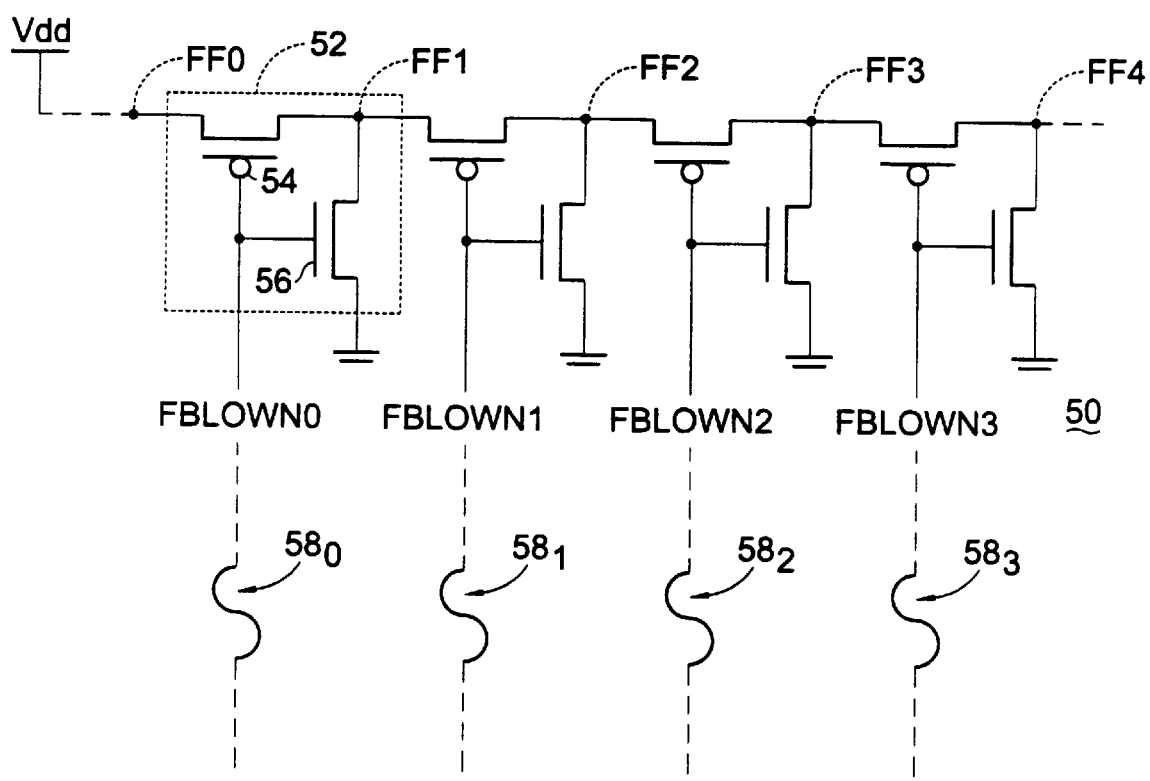
FIG. 2 is a simplified schematic illustration of a chain of P-channel and N-channel transistor pairs having their common connected gates coupled to receive respective input signals (FBLOWNX) from associated disable fuses and presenting a series of intermediate nodes (FFX) useful in determining the relative position of a selected group as compared to another selected group within the chained set.

With reference additionally now to FIG. 2, a portion of a circuit 50 is shown which allows a group of elements which share a single disable fuse (as, for example, may be utilized in the memory device 10 to disable certain memory array $12_0$ or $12_1$ word lines to enable redundant memory elements to be substituted therefor) to be placed on an N element pitch thereby significantly reducing the on-chip area need for such fuses. Each group of N elements in the device contains that portion of the circuit 50 illustrated as block 52 so that adjacent blocks 52 may be connected as shown.

The block 52 may comprise a P-channel MOS transistor 54 (or switching device) coupled between a source of supply voltage (i.e. Vdd) at node FF0 and an adjacent node FF1 coupled to a next P-channel device as shown. An N-channel MOS transistor 56 (or switching device) couples node FF1 (and all succeeding nodes FF2 etc.) to circuit ground, or another supply voltage line. The gates of transistor 54 and 56 are coupled together in each of the blocks 52 and controlled by a signal FBLOWN0, FBLOWN1, FBLOWN2 and FBLOWN3 at the circuit nodes indicated.

In operation, when the fuses 580 through 583 are intact, the corresponding signal lines FBLOWN0 through FBLOWN3 respectively are at a circuit ground ("Gnd") potential. In this condition, the P-channel transistor 54 of each of the blocks 52 are "on" and the corresponding N-channel transistor 56 is "off". Thus, assuming node FF0 is at Vdd, each of the succeeding intermediate nodes FF1 through FF4 will also be at Vdd. On the other hand, if one of the fuses $58_0$ through $58_3$ were to be blown (i.e. "open"), then the corresponding signal line FBLOWN0–FBLOWN3 would then be at Vdd instead of circuit ground. For example, if fuse $58_1$ is blown, then signal line FBLOWN1 goes to Vdd. This turns "off" the P-channel transistor 54 in the corresponding block 52 to the right of node FF1 and turns "on" the associated N-channel transistor coupled to node FF2 thereby bringing it to circuit ground.

Stated another way, the circuit 50 enables an element group within a chained set of groups to determine whether it is the "leftmost" (or first) group used within the set by monitoring the state of nodes F0 through FF4. Since any of the nodes FF0–FF4 will be low if (and only if) a fuse $58_N$ within the set, and located to the left of an adjacent node FFx is blown, that is if fuse "M" is blown where M<x. Stated another way, any of the nodes FF0–FF4 will be low if it is located distally from the supply voltage line Vdd and the fuse $58_N$ which has been blown.

As will be more fully described hereinafter, by then adding 2N signals which run horizontally the width of the set, N signals selecting an element within the "first" group and second N signals selecting an element within the "second" group, the determination can be made to disable any given element based on signals FBLOWN0 through FBLOWN3, FFx and the horizontal signals. Illustratively, in an "N=2" embodiment, the horizontal signals would comprise a "right select" and a "left select" signal for each of the "1st" and "2nd" groups within the set. This allows any two elements within the set (even both members of a pair that share a fuse) to be disabled according to the following Table 1:

TABLE 1

| FBLOWN | | 1st Element | | 2nd Element | | |
|---|---|---|---|---|---|---|
| X | FFX | Right Sel | Left Sel | Right Sel | Left Sel | Action |
| Gnd | *[1] | * | * | * | * | None |
| Vdd | Vdd | Vdd | Gnd | * | * | Diseble Right |
| Vdd | Vdd | Gnd | Vdd | * | * | Disable Left |
| Vdd | Vdd | Vdd | Vdd | * | * | Disable Both |
| Vdd | Gnd | * | * | Vdd | Gnd | Disable Right |
| Vdd | Gnd | * | * | Gnd | Vdd | Disable Left |
| Vdd | Gnd | * | * | Vdd | Vdd | Disable Both[2] |
| Vdd | * | Gnd | Gnd | Gnd | Gnd | Disable None[3] |

Key:
[1] = Don't care
[2] = State may or may not be useful
[3] = State may be useful in test modes where redundancy is to be "turned off" and the original elements are to be "re-installed."
Disable Right = Disable Right Element within pair (or group)
Disable Left = Disable Left Element, within pair (or group)
Disable Both = Disable Both Elements within pair (or group)

Figure 3:
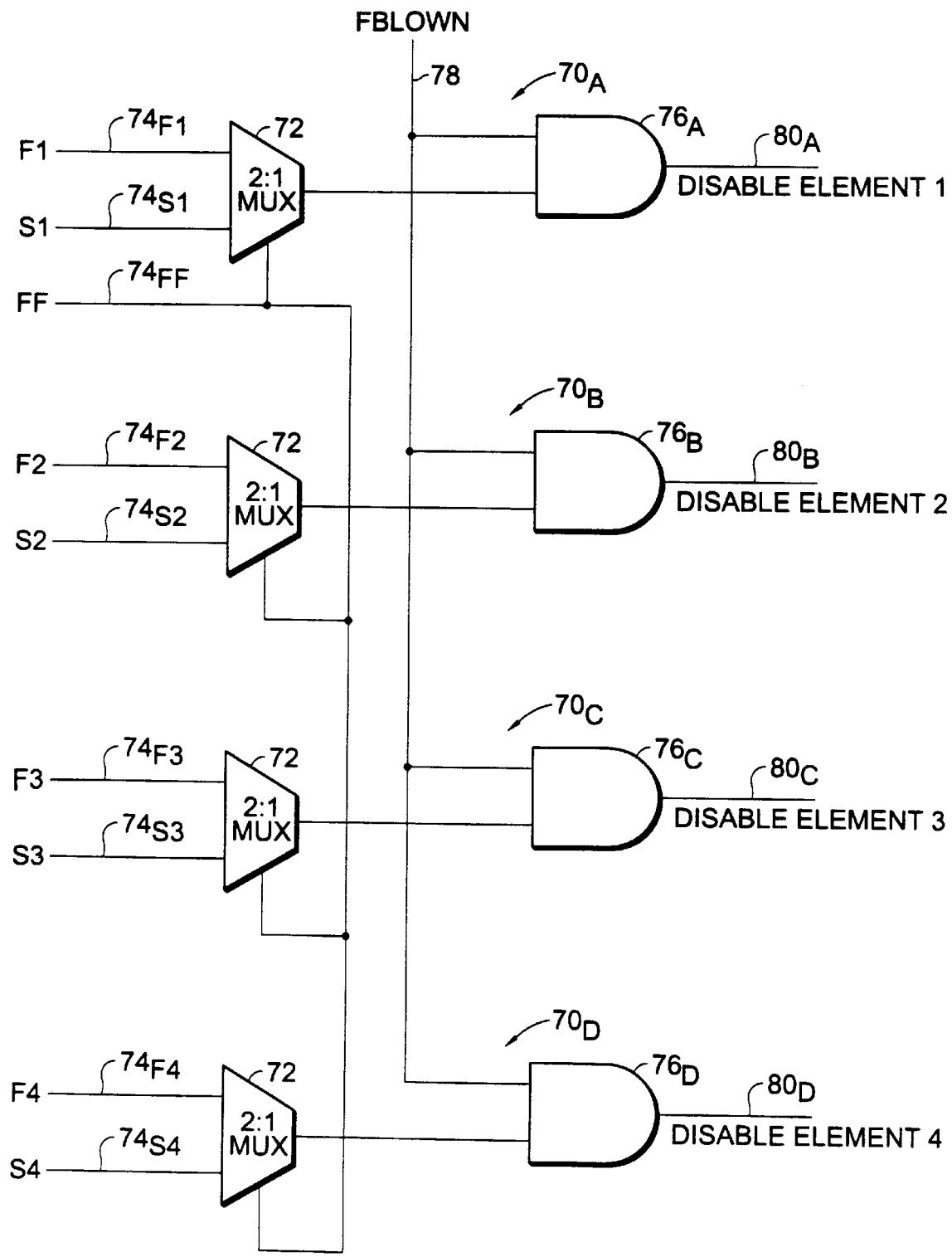
FIG. 3 is a simplified logic flow diagram of a particular circuit implementation of the technique of the present invention which may make use of the chain of active devices illustrated in FIG. 2.

With reference additionally now to FIG. 3, a technique by which one fuse can service a group of four elements in an integrated circuit device is shown. This illustration shows a number of circuits $70_A$ through $70_D$ which individually comprise a 2-to-1 multiplexer ("MUX") 72 coupled to AND gates. The multiplexers 72 have as inputs a pair of corresponding signal lines $74_{F1}$, $74_{S1}$ through $74_{F4}$, $74_{S4}$ as shown as well as an individual select line $74_{FF}$ to select the input line that will be passed to the output of the corresponding multiplexer 72. The output of the multiplexers 72 are supplied to a corresponding combinatorial logic gate (e.g. an AND gate) $76_A$ through $76_D$ which has as another input a common signal line 78 indicative of whether or not an associated fuse has been "blown". The output of the AND gates $76_A$ through $76_D$ is a signal to disable a corresponding element 1 through 4 appearing on output lines $80_A$ through $80_D$ respectively.

Since up to two fuses 58 may be blown within a given set in a particular embodiment of the present invention, each fuse 58 can be either the "first" or "second" fuse blown as previously described. Determining whether a particular blown fuse is the "first" or the "second" has been described above. Once a fuse 58 has been identified as either the "first" one blown (or the "second"), the next step is to determine which element, of the four elements associated with that given fuse 58 is to be disabled.

In the exemplary illustration shown, the technique uses eight signal lines to effectuate the selections. Four lines ($74_{F1}$, $74_{F2}$, $74_{F3}$ and $74_{F4}$) determine which of the four elements is to be disabled if the fuse 58 is the "first" one blown and four lines ($74_{S1}$, $74_{S2}$, $74_{S3}$ and $74_{S4}$) select which of the four elements is to be disabled if the fuse 58 is the "second" fuse blown. Select line $74_{FF}$ determines which of the inputs will be passed to the output of the multiplexers 72.

Figure 4:
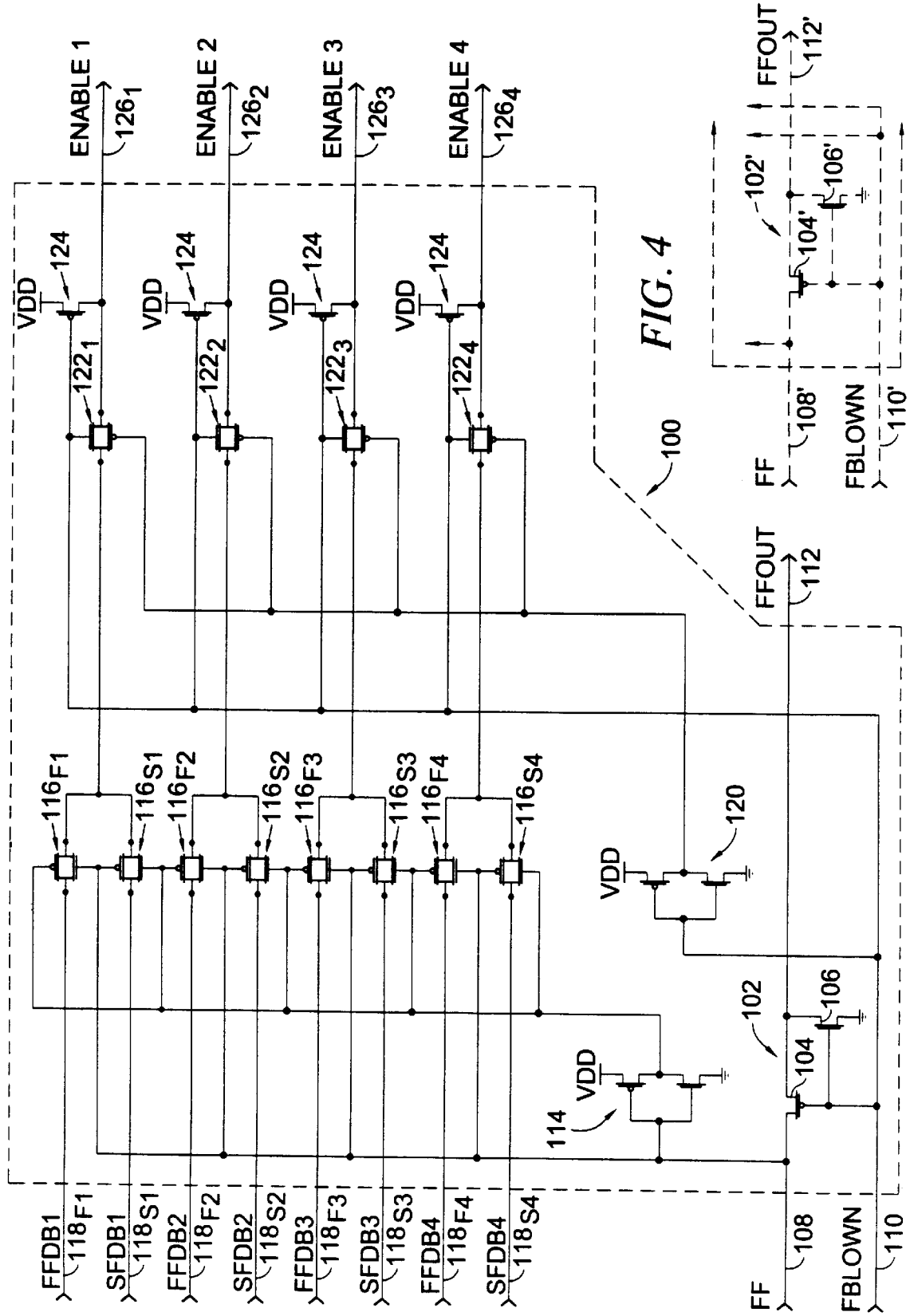
FIG. 4 is a more detailed gate level illustration of the circuit implementation, incorporating the circuits of FIGS. 2 and 3, and showing the technique by which one or more elements can be disabled within a group for possible use in the integrated circuit memory device of FIG. 1 or other integrated circuit devices incorporating replaceable and/or redundant circuit elements.

With reference additionally now to FIG. 4, a particular fuse decoder ("FUSEDEC") circuit 100 implementation of the technique above described is shown for possible use with the exemplary memory device 10 of FIG. 1. In this illustration, the block 102 corresponds to block 52 of FIG. 2 and the P-channel and N-channel transistors 104 and 106 correspond to transistors 54 and 56 respectively. Each of the blocks 102, $102^1$ etc. receive a first fuse ("FF") signal from a left adjacent block 102 on line 108 and supply a first fuse out ("FFOUT") signal to a right adjacent block 102 on line 112. A fuse blown "FBLOWN") signal is received on line 110 corresponding to the signals FBLOWN0 through FBLOWN3 of FIG. 2.

The circuit 100 includes an inverter 114 which has its input coupled to FF line 108 and its output coupled to the gates of a number of parallel coupled P-channel and N-channel transistors functioning as multiplexers in pairs: $116_{F1}$, $116_{S1}$; $116_{F2}$, $116_{S2}$; $116_{F3}$, $116_{S3}$; and $116_{F4}$, $116_{S4}$ corresponding to the multiplexers 72 of FIG. 3. The FF line 108 in conjunction with the inverted output of inverter 114 serve to determine the output of the various multiplexers $116_{X1}$, $116_{X2}$, $116_{X3}$ and $116_{X4}$ (where X=either "first" ("F") or "second" ("S")).

Inputs to the multiplexers $116_{X1}$, $116_{X2}$, $116_{X3}$ and $116_{X4}$ are received on lines $118_{F1}/118_{S1}$; $118_{F2}/118_{S2}$; $118_{F3}/118_{S3}$; and $118_{F4}/118_{S4}$ respectively and the signal that will be passed to the output of the respective multiplexer 116 is determined by the state of FF line 108.

The circuit 100 also includes an inverter 120 having its input coupled to FBLOWN line 110. The output of the inverter 120 is coupled to the gate terminals of a number of P-channel transistors coupled in parallel with a like number of N-channel transistors forming gates $122_1$ through $122_4$ inclusive. A corresponding P-channel transistor 124 is associated with each of the gates $122_1$ through $122_4$ to perform the AND function. The signal on FBLOWN line 110 is coupled to the gates of the N-channel transistors of gates $122_1$ through $122_4$ as well as P-channel transistors 124.

Outputs from the multiplexers $116_{X1}$, $116_{X2}$, $116_{X3}$ and $116_{X4}$ are supplied to one terminal of the gates $122_1$ through $122_4$ respectively and a corresponding ENABLE1 through ENABLE4 signal is produced on lines $126_1$ through $126_4$.

In a particular implementation in conjunction with the memory device 10 of FIG. 1, the circuit 100 may be located below the row decoders ("ROW DEC") $30_0$ and $30_1$ and is placed 16 times per 256K memory array $12_0$, $12_1$ block. All inputs are local to a 256K block. The FF signal on line 108 is driven from the previous FUSEDEC circuit 100 and is daisy-chained to the next. The FBLOWN signal on line 110 is generated in the fuse circuit associated with these four enable lines. All other inputs are generated in the fuse logic block which is local to a 256K block and is located between the pads of the memory device 10. The outputs ("ENABLE1–ENABLE4") go to the row decoder $30_0$, $30_1$ circuits directly above this circuit.

The following describes in greater detail the signals illustrated and above-described.

First Fuse ("FF")—Comes from the FFOUT line 112 of the previous FUSEDEC circuit 100.

First Fuse Out ("FFOUT")—Connects to the FF input line 108 of the adjacent or subsequent (next) FUSEDEC circuit 100.

Fuse Blown ("FBLOWN")—Based on fuse. "High" on line 110 indicates that the fuse 58 is blown, i.e., that one or more of the ENABLE# signals on lines $126_1$ through $126_4$ should go "Low".

First Fuse Disable 1–4 ("FFDB1–FFDB4") and Second Fuse Disable 1–4 ("SFDB1–SFDB4")—These signals on lines 118 control which of the elements within the four-element set should be disabled. The FFDB# signals will control if FBLOWN is the first blown fuse in the sequence, otherwise, SFDB# will control ENABLE#.

Enable 1–4 ("ENABLE1–ENABLE4")—These signals on lines 126 will enable or disable each of the four elements controlled by the FBLOWN fuse.

While there have been described above the principles of the present invention in conjunction with a specific integrated circuit memory device, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device having a number of replaceable elements thereon, said device comprising:
   a plurality of element disable fuses for controlling application of a control signal to a corresponding plurality of circuit nodes;
   a like plurality of first switching devices each having a control terminal thereof coupled to one of said corresponding plurality of circuit nodes, said plurality of first switching devices presenting a corresponding number of intermediate nodes, said plurality of first switching devices being series connected for selectively biasing said intermediate nodes at a first potential defined by a first voltage source; and a like plurality of second switching devices each having a control terminal thereof also coupled to one of said corresponding plurality of circuit nodes, each of said plurality of second switching devices coupling one of said intermediate nodes to a second potential, said second potential offset from said first potential, whereby said corresponding number of intermediate nodes are at said first potential thereof when none of said plurality of element disable fuses is in an open state thereof and a subset of said intermediate nodes distal from a given one of said intermediate nodes and said first voltage source are at said second potential thereof when a corresponding one of said plurality of element disable fuses is in said open state.

2. The integrated circuit device of claim 1 wherein said plurality of first switching devices comprise P-channel transistors.

3. The integrated circuit device of claim 2 wherein said P-channel transistors comprise MOS devices.

4. The integrated circuit device of claim 1 wherein said plurality of second switching devices comprise N-channel transistors.

5. The integrated circuit device of claim 4 wherein said N-channel transistors comprise MOS devices.

6. The integrated circuit device of claim 1 further comprising:

a multiplexer having a plurality of input signal lines thereof for receiving at least a first and second element replacement signal and a select signal line coupled to one of said intermediate nodes for determining which of said first and second element replacement signals to apply to an output signal line of said multiplexer; and a combinatorial logic gate having a first input thereof coupled to said output signal line of said multiplexer and a second input thereof coupled to one of said circuit nodes corresponding to said one of said intermediate nodes to which said multiplexer select signal line is coupled, said combinatorial logic gate having an output signal line for providing a selected element replacement signal to a replaceable element of said integrated circuit device.

7. The integrated circuit device of claim 6 wherein said multiplexer comprises a number of parallel coupled switching devices.

8. The integrated circuit device of claim 7 wherein said parallel coupled switching devices comprise P-channel and N-channel transistor pairs.

9. The integrated circuit device of claim 6 wherein said combinatorial logic gate comprises an AND gate.

10. The integrated circuit device of claim 6 comprising a plurality of multiplexers and combinatorial logic gates associated with said one of said intermediate nodes and said circuit nodes corresponding to said one of said intermediate nodes to which said multiplexer select signal is coupled.

11. The integrated circuit device of claim 1 wherein said integrated circuit device comprises a memory array.

12. The integrated circuit device of claim 11 wherein said replaceable elements comprise word lines of said memory array.

13. A method for disabling selected replaceable elements of an integrated circuit device, said method comprising the steps of:

providing a plurality of element disable fuses for controlling application of a first voltage source to a corresponding plurality of circuit nodes;

switchably coupling each of said plurality of circuit nodes to each of a like plurality of series coupled intermediate nodes;

monitoring said plurality of series coupled intermediate nodes; and determining whether one of said plurality of element disable fuses is a first or subsequent fuse to be blown based upon a logic level monitored at said intermediate nodes.

14. The method of claim 13 further comprising the steps of:

generating a first signal if said one of said plurality of element disable fuses is said first fuse to be blown; and alternatively generating a second signal if said one of said plurality of element disable fuses is said subsequent fuse to be blown.

15. The method of claim 13 further comprising the steps of:

supplying right element and left element select signals;

multiplexing said right and left element select signals with said first and second signals to produce an output signal; and disabling selected ones of said replaceable elements based upon said output signal and a state of a corresponding one of said circuit nodes.

16. The method of claim 13 wherein said step of switchably coupling is carried out by pairs of P-channel and N-channel transistors having common coupled gate terminals thereof.

17. The method of claim 13 wherein said step of determining comprises the step of:

applying a signal corresponding to said monitored logic level to a select input of a multiplexer.

18. The method of claim 14 wherein said step of generating produces said first signal at a first supply voltage level of said integrated circuit device and said step of alternatively generating produces said second signal at a second supply voltage level of said integrated circuit device.

19. The method of claim 18 wherein said step of generating produces said first signal substantially equal to Vdd and said step of alternatively generating produces said second signal substantially equal to circuit ground.

20. The method of claim 15 wherein said step of disabling selected ones of said replaceable elements is carried out by means of a combinatorial logic gate.

* * * * *